United States Patent
Hsu et al.

(10) Patent No.: US 7,060,546 B2
(45) Date of Patent: Jun. 13, 2006

(54) ULTRA-THIN SOI MOSFET METHOD AND STRUCTURE

(75) Inventors: Louis Hsu, Fishkill, NY (US); Carl J. Radens, LaGrangeville, NY (US); Ramachandra Divakaruni, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 322 days.

(21) Appl. No.: 10/707,200

(22) Filed: Nov. 26, 2003

(65) Prior Publication Data

US 2005/0112811 A1    May 26, 2005

(51) Int. Cl.
H01L 21/336 (2006.01)
H01L 21/8234 (2006.01)
H01L 21/3205 (2006.01)
H01L 21/4763 (2006.01)
H01L 21/44 (2006.01)

(52) U.S. Cl. ................. 438/197; 438/655; 438/682; 438/592

(58) Field of Classification Search ........... 438/197, 438/589, 630, 649, 721, 595, 218, 576, 581, 438/583, 592, 655, 651, 644

See application file for complete search history.

(56) References Cited

U.S. PATENT DOCUMENTS

| | | | |
|---|---|---|---|
| 4,830,975 A | | 5/1989 | Bovaird et al. |
| 5,793,089 A | * | 8/1998 | Fulford et al. ............... 257/408 |
| 5,851,921 A | * | 12/1998 | Gardner et al. ............. 438/655 |
| 6,060,749 A | * | 5/2000 | Wu ............................. 257/347 |
| 6,355,955 B1 | * | 3/2002 | Gardner et al. ............. 257/330 |
| 6,395,589 B1 | * | 5/2002 | Yu ............................... 438/183 |
| 6,506,649 B2 | * | 1/2003 | Fung et al. .................. 438/300 |
| 6,555,880 B2 | * | 4/2003 | Cabra et al. ................. 257/384 |
| 6,566,198 B2 | * | 5/2003 | Park et al. ................... 438/259 |
| 6,858,903 B2 | * | 2/2005 | Natzle et al. ............... 257/368 |
| 6,908,815 B2 | * | 6/2005 | Ye et al. ...................... 438/258 |
| 6,914,303 B2 | * | 7/2005 | Doris et al. ................. 257/350 |

* cited by examiner

*Primary Examiner*—Chuong Anh Luu
(74) *Attorney, Agent, or Firm*—Howard M. Cohn; H. Daniel Schnurmann

(57) ABSTRACT

An ultra-thin, scaleable MOSFET transistor and fabrication method are described. The transistor features fully self-aligned, raised source/drain junctions on a thin SOI wafer and exhibits low contact resistance, low gate resistance and good device isolation characteristic. No extra lithographic mask steps are required beyond those required by conventional processes. The transistor is completely "bracketed" or surrounded by STI (shallow trench isolation), providing inherent isolation between it and any other devices on the SOI wafer. Gate sidewall spacers are formed outside of the gate area so that the scalability is limited solely by lithography resolution.

12 Claims, 7 Drawing Sheets

ULTRA-THIN SOI MOSFET METHOD AND STRUCTURE

BACKGROUND OF INVENTION

The present invention relates to a semiconductor device, and more particularly to an ultra-thin, short-channel metal oxide semiconductor field effect transistor (MOSFET).

In 1965, Dr. Gordon Moore, then Director of Research and Development for Fairchild Semiconductor, made the observation that the number of transistor devices per integrated circuit had been doubling every couple of years since the creation of the first integrated circuits in the late 1950's and that he expected the trend to continue for the foreseeable future. This observation was dubbed "Moore's Law" by the trade press. Now almost 40 years later, despite numerous dire predictions of fundamental obstacles, unrelenting industry efforts towards every-increasing semiconductor density have effectively affirmed Dr. Moore's prophetic observation, and the trend is still expected to continue unabated for the foreseeable future. The process of reducing semiconductor device size to increase integrated circuit density is generally referred to as "scaling".

Ongoing scaling efforts of semiconductor MOS (Metal-Oxide-Semiconductor) devices not only contribute to higher integrated circuit packing density, but also improve integrated circuit performance. As the scaling process proceeds towards the physical limits of currently available MOS technologies and techniques, new technologies and techniques are developed to further decrease device size and increase device performance. As MOS device size decreases, tremendous challenges arise in the areas of device modeling accuracy and process integration. The latest technologies for fabricating integrated circuits (or ICs) using "silicon on insulator" (or SOI) substrates have propelled semiconductor technology ahead for another generation or two of scaling. These SOI-based technologies accomplish this by balancing more expensive SOI wafer substrates with more advanced lithographic patterning tools and techniques. Integrated MOS devices based on thinner SOI substrates provide fully depleted transistor bodies, effectively eliminating undesirable floating body effects. Accordingly, there is a trend in the semiconductor industry towards ultra-thin MOS devices based upon ever-thinner SOI substrates. Another advantage of using ultra-thin SOI substrates is that they permit the body regions of MOS devices to experience a "strain" condition such that carrier mobility (both electrons and holes) is enhanced. The thinner the silicon layer of the SOI substrate, the greater the strain applied to it by the gate dielectric and buried oxide layer (BOX). A significant drawback of such ultra thin SOI devices is that effective source and drain contact resistance is drastically increased, limiting device performance.

Still, some of the benefits of bulk devices with extremely shallow source/drain junction layers are unavoidable in modern scaled MOS device since this approach tends to minimize the short channel effect, eliminating a major impediment to device performance. As attractive as the benefits of ultra-thin source drain structures may be, shallow junctions on bulk silicon and thin SOI are incompatible with conventional high-conductivity silicide processes. Without the low contact resistance afforded by silicidation in source/drain regions, the resulting contact resistance of the thin junction becomes unworkably large.

One common solution to the problem of high effective contact resistance in shallow source/drain junctions is to increase the source and drain junction thickness (raised source/drain) thereby permitting silicidation of the excess silicon, which in turn significantly reduces effective source/drain contact resistance. One popular approach for achieving this is to fabricate MOS devices using thin SOI wafers in combination with raised source/drain junctions so that junction capacitance is reduced. Such "thin SOI" structures tend to range in thickness from several tenths of a micrometer to over 100 micrometers of thickness. In these MOS structures, the channel is fully depleted. As a result there is no unpredictable floating body effect.

An example of this approach is described in U.S. Pat. No. 6,395,589, issued May 28, 2000 to Bin Yu (hereinafter "YU"), entitled "Fabrication of Fully Depleted Field Effect Transistor with High-k Gate Dielectric in SOI Technology". In YU, a thin-SOI layer is used to form a fully depleted channel region, where source and drain are elevated using an epitaxial growth process. There are a couple of problems with this technique: (1) YU does not deal with the formation of device isolation structures. Device isolation is critical to such an approach, since improper or ineffective device isolation will lead to source/drain shorting. (2) YU describes the use a Damascene gate process to form the gate of the device, requiring the formation of sidewall spacers inside the gate region. Using this approach, if the gate dimension is scaled to about twice the sidewall dimension, the technique becomes useless. The dimension of the sidewall spacer is on the order of 0.1 micrometers, and today's typical gate dimension is in the same range. With further scaling, however, the formation of sidewall spacers inside of the gate structure becomes unattractive. Although lithographic processes are capable of accurately patterning gate structures in the nanometer range, at such small sizes the relatively coarse dimensional tolerances on the sidewall spacers described in YU become unacceptably large with respect to the gate dimensions.

Another example is described in U.S. Pat. No. 6,506,649, issued Jan. 14, 2003 to Ka Hing Fung et al., entitled "Method for Forming Notch Gate Having Self-Align Raised Source/Drain Structure", (hereinafter "FUNG"). Like YU, FUNG does not describe any device isolation scheme. In FUNG, a notch-undercutting dimension is a limiting factor on minimum gate dimension. Similar to YU, if the FUNG notch-undercutting dimension is in the range of 0.1 micrometer, then this method is not useful for forming gates whose dimensions are in the nanometer range. This means that control of the final gate dimension will be very poor since sidewall spacer tolerances and notch dimension tolerances are both relatively coarse compared the gate dimension. As the gate dimension is reduced into the nanometer range, the gate dimension tolerance must be tightly controlled. However, the relatively coarse dimensional tolerances on the FUNG sidewall spacer and notch dimensions prevent accurate control of a nanometer-range gate dimension fabricated according the method described in FUNG.

U.S. Pat. No. 4,830,975, issued May 16, 1989 to Bovaird et al, entitled "Method of Manufacturing a PRIMOS Device" (hereinafter "BOVAIRD") describes an alternative to using an epitaxial growth technique for forming raised source and drain structures in MOS devices. In BOVAIRD, an etching process is used create a recessed channel region, effectively elevating source and drain structures with respect to the channel. Although, BOVAIRD does clearly describe how device isolation structures are formed, a significant drawback of the BOVAIRD technique is that it is not self-aligned. As a result, the BOVAIRD technique is unable to meet the stringent tolerance requirements of today's nanometer-range gates.

Another subtractive but self-aligned method is taught in U.S. Pat. No. 6,060,749, issued May 9, 2000 to Shye-Lin Wu, titled "Ultra-Short Channel Elevated S/D MOSFETS Formed on an Ultra-Thin SOI Substrate" (hereinafter "WU"). WU describes a controlled method for selectively removing a portion of an SOI layer in a channel region. The resulting structure has reduced SOI thickness in its channel region as compared to its source and drain regions. The technique described in WU also permits sidewall spacers to form in self-aligned fashion after the gate is formed. This produces gate and spacers are well-defined and self-aligned to one other. A problem with this approach, however is difficulty in controlling SOI thickness in the channel region. Like YU and FUNG, WU does not teach how device isolation is formed.

SUMMARY OF INVENTION

The present inventive technique overcomes the problems cited above by providing an ultra-thin, scaleable MOSFET transistor and fabrication method with a fully self-aligned, raised source/drain junctions. The transistor is readily fabricated on a thin SOI wafer and exhibits low contact resistance, low gate resistance and good device isolation characteristic. No extra lithographic mask steps are required beyond those required by conventional processes. The transistor is completely "bracketed" or surrounded by STI (shallow trench isolation), providing inherent isolation between it and any other devices on the SOI wafer. Gate sidewall spacers are formed outside of the gate area so that the scalability is limited solely by lithography resolution.

The present inventive technique provides raised source/drain junctions by employing chem-mech polishing/planarization in combination with other processing techniques to form device isolation, source, drain and gate structures in fully self-aligned fashion.

A typical embodiment of the present inventive method employs triple chem-mech polishing and can be summarized as: (1) Employing a first Damascene process to form an isolation region, thereby defining the device's (MOSFET's) active area (AA); (2) Employing a second Damascene process is to form source/drain regions after an selective epitaxial growth; (3) Employing a third Damascene process form a fully self-aligned gate region where sidewall spacers are formed outside of the gate region, (i.e. within the source/drain regions), so that gate dimension can be precisely controlled by conventional lithographic techniques; (4) Performing silicidation in the source and drain region and sealing by means of a dielectric cap process so that source/drain and gate formation will not interfere with one other; (5) Forming relatively short gate poly, strapped by a conductive metal, to minimize gate resistance (a silicide gate structure is unnecessary).

According to an aspect of the invention, a MOSFET semiconductor device is formed on a semiconductor substrate comprising a buried insulating layer, a thin silicon layer overlying the buried insulating layer and a hard polish-stop layer overlying the thin silicon layer. An isolation trench is formed surrounding and defining an active area of the MOSFET device. The trench extends downward through the hard polish-stop layer and thin silicon layer to the buried insulating layer. Next, the trench is filled with an isolation material, such as oxide. Next, the polish-stop layer is selectively etched to expose source/drain areas of the thin silicon layer, leaving behind a sacrificial dummy gate structure overlying a channel area of the thin silicon layer. An implantation process is used to dope the exposed source/drain areas to form source/drain junctions. Sidewall spacers are then formed surrounding the source/drain areas along vertical side walls of the isolation material and dummy gate structure. Doped silicon is selectively deposited to elevate the source/drain junctions. A silicidation process is then employed to form source/drain silicide conductors on top of the elevated source/drain junctions. Protective caps are formed over the source/drain silicide conductors, and the sacrificial dummy gate is removed, thereby forming a gate opening and exposing the channel area. The channel area is implanted to form the channel of the MOSFET device. A thin gate dielectric is formed in the gate opening and a gate conductor is formed in the gate opening over the gate dielectric.

According to various aspects of the invention, the hard polish stop layer can be CVD diamond, the substrate can be an SOI substrate, and Damascene processes are used to form the device isolation (in the isolation trench) and/or gate conductor.

After forming the basic transistor as described above, conventional interconnect techniques are used to connect to the MOSFET device. Typically the MOSFET device will be a part of a CMOS circuit and/or part of a larger integtated circuit device. Interconnection can be accomplished, for example, by employing conductive studs to connect between the source/drain conductors, gate conductor, and subsequently formed metal interconnect layers.

The resultant inventive MOSFET transistor is characterized by STI (shallow trench isolation) completely surrounding the active area of the transistor and isolating it from any other devices that share the substrate with it. This isolation is inherent in the design of the present inventive transistor and the process that forms it. The inventive MOSFET device is further characterized by isolation (STI), sidewall spacers and a gate conductor the tops of which are all coplanar, as well as a "U" shaped dielectric (as seen in cross-section), where the dielectric extends along the bottom surface and sides of the gate conductor.

BRIEF DESCRIPTION OF DRAWINGS

These and further features of the present invention will be apparent with reference to the following description and drawing, wherein.

DETAILED DESCRIPTION

The present inventive technique produces raised source/drain junctions in MOS devices on a thin-SOI wafer with a robust isolation scheme by employing chem-mech polishing/planarization in combination with other processing techniques to form device isolation, source drain and gate structures in fully self-aligned fashion.

In a preferred embodiment of a method for forming a MOSFET device, triple chem-mech polishing is employed.

This method can be summarized as: (1) Employing a first Damascene process to form an isolation region, thereby defining the device's (MOSFET's) active area (AA); (2) Employing a second Damascene process is to form source/drain regions after an selective epitaxial growth; (3) Employing a third Damascene process form a fully self-aligned gate region where sidewall spacers are formed outside of the gate region, (i.e. within the source/drain regions), so that gate dimension can be precisely controlled by conventional lithographic techniques; (4) Performing silicidation in the source and drain region and sealing by means of a dielectric cap process so that source/drain and gate formation will not interfere with one other; (5) Forming relatively short gate poly, strapped by a conductive metal, to minimize gate resistance (a silicide gate structure is unnecessary).

Figure 1:
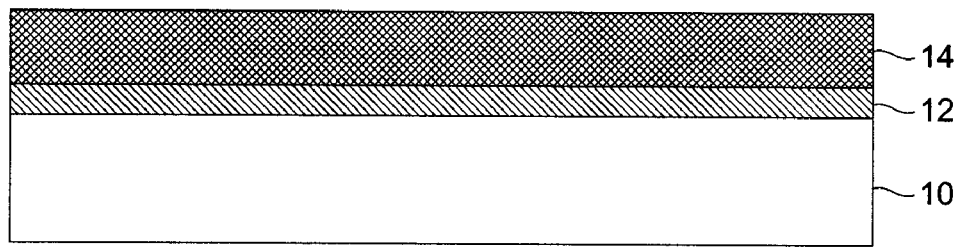
FIGS. 1–14 are cross-sectional diagrams a short-channel, ultra-thin MOSFET on an SOI substrate at a series of sequential processing steps, in accordance with the invention.

FIG. 1 is a cross-sectional diagram of an SOI wafer substrate 100 on which a short-channel, ultra-thin MOSFET is to be formed in accordance with the invention. The wafer substrate structure has a buried oxide layer 10. Overlying the buried oxide layer 10 is a thin, single-crystal silicon layer 12 with a thickness of 10 nm to 100 nm. The thin, single-crystal silicon layer (film) 12 is coated with a CVD (Chemical Vapor Deposition) dielectric area of a material such as CVD diamond that acts both as a dielectric and as a hard polish-stop layer 14. The polish-stop layer 14 also acts as a part of device isolation. CVD diamond has good thermal conductivity and a high deposition rate. In addition, CVD diamond is an extremely hard material that is well-suited for use as polish-stop layer.

Figure 2:
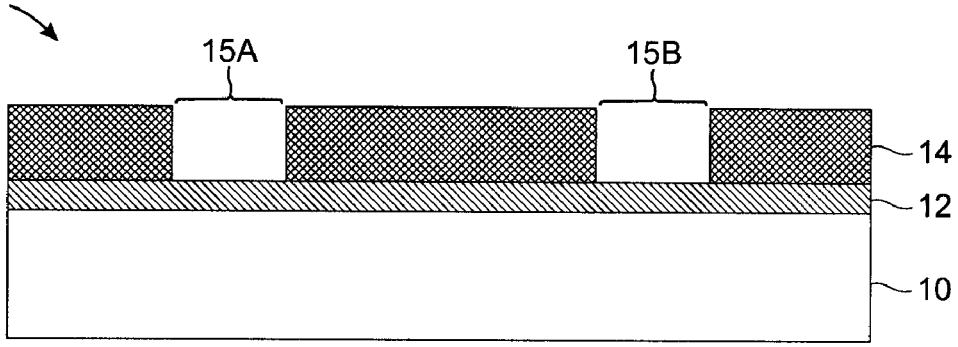

FIG. 2 is a cross-sectional diagram of a wafer substrate 200 representative of the wafer substrate 100 of FIG. 1 after etching to form field isolation "trenches" 15A and 15B (also known as STI or "shallow trench isolation"). Although appearing as separate trenches 15A and 15B in FIG. 2, trenches 15A and 15B are actually opposite side portions of a STI "ring" that defines and bounds the active area (AA) into which the MOSFET device is formed. Preferably, field isolation "trenches" 15A and 15B are formed by employing a oxygen plasma etching process to selectively etch away the polish-stop layer 14 through a non-erodable first mask (e.g., nitride) that defines the field isolation area. This type of etching process is highly selective to CVD diamond, causing it to stop at the top surface of the thin silicon layer 12. The first mask is then removed.

Figure 3:
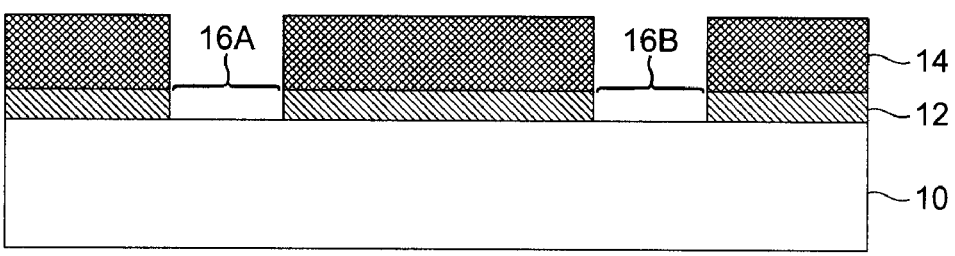

FIG. 3 is a cross-sectional diagram of a wafer substrate 300 representative of the wafer substrate 200 of FIG. 2 after a second selective etching process. Preferably, a $CL_2$ base plasma etching process is used to continue etching through the thin silicon layer 12 in the field isolation "trenches". This type of etching process is generally selective to silicon over oxide and stops at the buried oxide layer 10, removing only areas 16A and 16B of the thin silicon layer 12 in the isolation "trenches" 15A and 15B.

Figure 4:
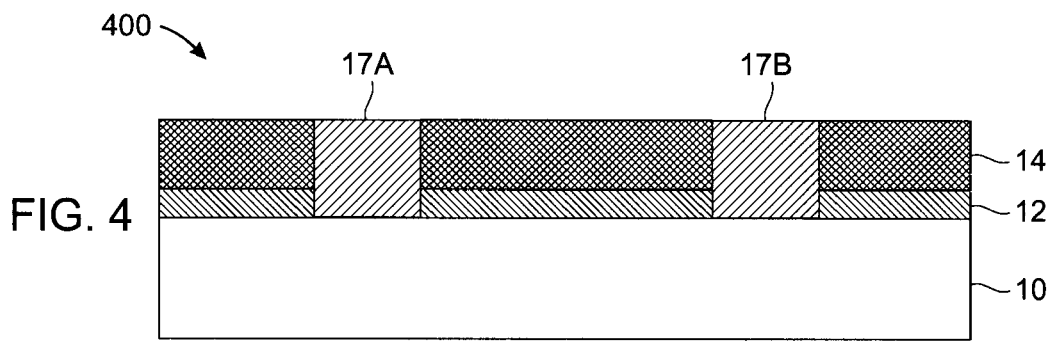

FIG. 4 is a cross-sectional diagram of a wafer substrate 400 representative of the wafer substrate 300 of FIG. 3 after filling the field isolation trenches with oxide fill 17A and 17B, thereby forming an isolation area surrounding the active area (AA). Preferably, a Damascene process involving CVD oxide deposition followed by a chem-mech polishing process is used to form the oxide fill (17A, 17B). The field isolation area can be implanted and doped prior to filling to improved isolation strength if desired.

Figure 5:
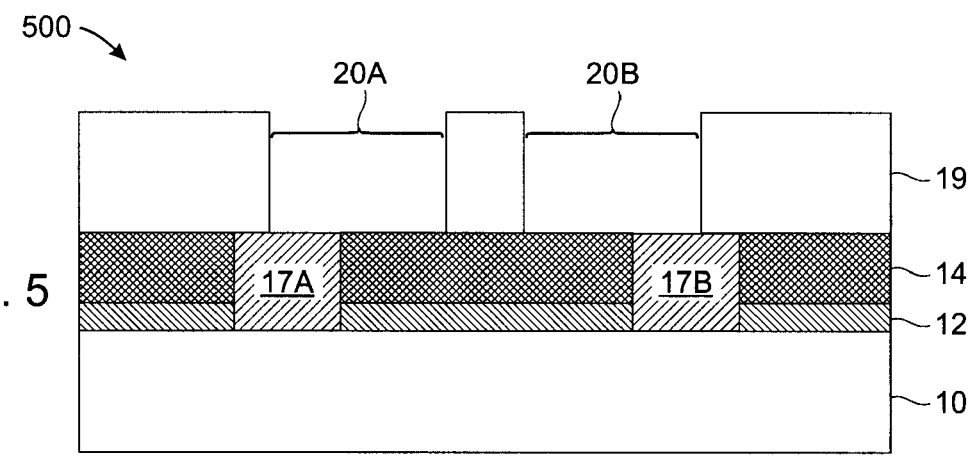

FIG. 5 is a cross-sectional diagram of a wafer substrate 500 representative of the wafer substrate 400 of FIG. 4 after patterning a second mask layer 19 over the top surface thereof. The mask 19 has openings 20A and 20B that define source and drain areas of the MOSFET being formed.

Figure 6:
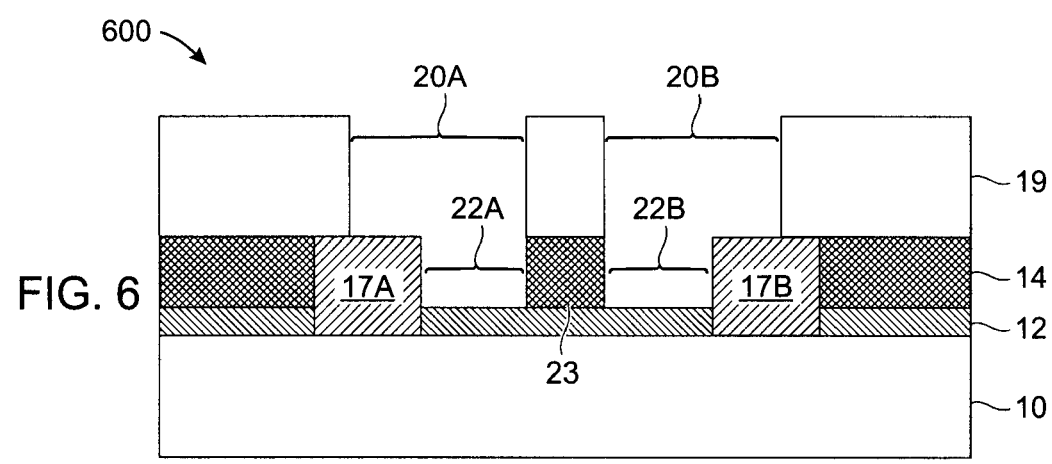

FIG. 6 is a cross-sectional diagram of a wafer substrate 600 representative of the wafer substrate 500 of FIG. 5 after employing an oxygen plasma etching process to selectively etch away the polish-stop layer 14 through the openings 20A and 20B in the mask 19 to form source/drain areas 22A and 22B. Because of the selectivity of the oxygen plasma etching process to CVD diamond over silicon and oxide, only the CVD diamond is removed, stopping at the top surface of the thin silicon layer 12. The selectiveness of the etching process causes the source/drain areas 22A and 22B to be self-aligned to the field oxide 17A and 17B. The etching process leaves behind a sacrificial CVD diamond gate "pedestal" 23 overlying what will become the channel area of the MOSFET being formed.

Figure 7:
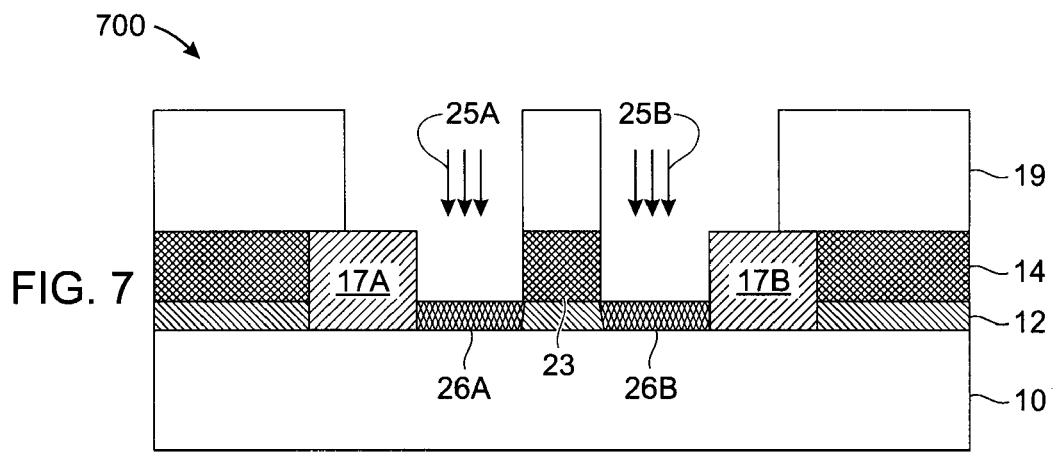

FIG. 7 is a cross-sectional diagram of a wafer substrate 700 representative of the wafer substrate 600 after an ion implantation process to form doped source/drain junctions 26A and 26B. The ion implantation process is represented in FIG. 7 by arrows 25A and 25B. Because the thin silicon layer 12 is extremely thin, a suitable doping energy should be chosen to avoid damage to the interface between the source/drain junctions 26A and 26B and the buried oxide layer 10. Because of the masking provided by the mask 19 and the sacrificial CVD diamond "dummy" gate 23, a portion of the thin silicon layer 12 underlying the dummy gate 23 remains undoped. This undoped region will become the channel region of the MOSFET in subsequent processing steps.

Figure 8:
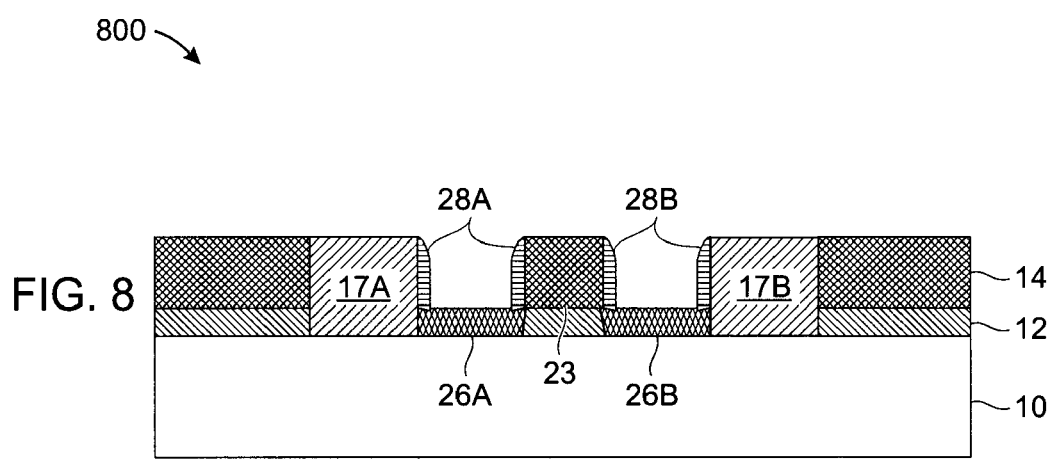

FIG. 8 is a cross-sectional diagram of a wafer substrate 800 representative of the wafer substrate 700 of FIG. 7 after removing the mask 19 and forming sidewall spacers 28A and 28B along vertical side walls of the field oxide 17A, 17B and dummy gate 23 surrounding the source/drain junctions 26A and 26B. Those of ordinary skill in the art will understand and appreciate that using this spacer technique, conventional lightly-doped drain (LDD) structures can be realized to reduce the "hot carrier" effect.

Figure 9:
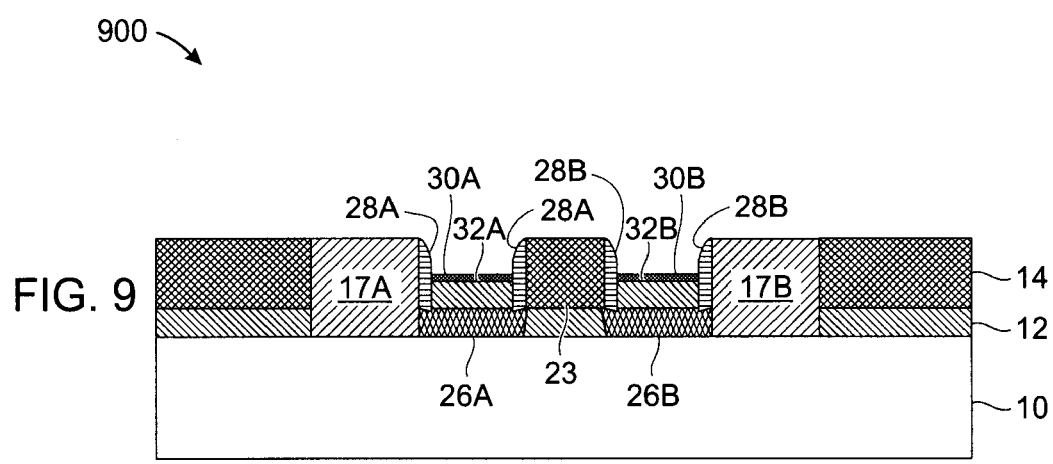

FIG. 9 is a cross-sectional diagram of a wafer substrate 900 representative of the wafer substrate 800 of FIG. 8 after using a selective epitaxial deposition process to grow source/drain silicon 30A, 30B to a suitable depth, effectively elevating the source/drain junctions 26A, 26B. Those of ordinary skill in the art will immediately understand that this can be accomplished by any of a variety of different techniques. One such technique is to use a Damascene process to "overgrow" the silicon and polish/planarize the "overgrown" silicon flush to the surface of the polish-stop layer 14, then to use a controlled etching process to recess the silicon to a suitable depth, as shown in the Figure. Optionally, the source/drain silicon 30A, 30B can be re-implanted after formation to achieve optimum doping. After formation of the source/drain silicon 30A, 30B (and after any optional re-implantation), a silicidation process is used to form high-conductivity silicide conductors 32A, 32B on top of the source/drain silicon 30A, 30B.

Figure 10:
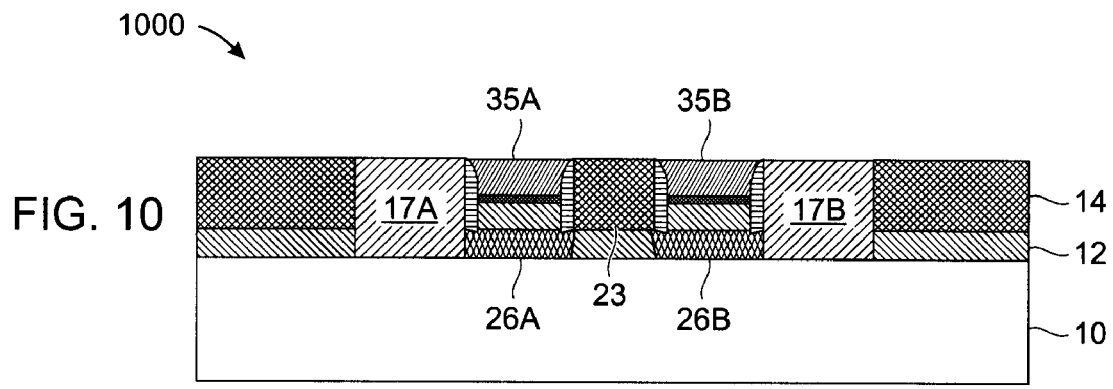

FIG. 10 is a cross-sectional diagram of a wafer substrate 1000 representative of the wafer substrate 900 of FIG. 9 after capping the exposed source/drain areas with CVD oxide caps 35A and 35B using conventional capping techniques. The silicide conductors 32A and 32B (see FIG. 9) are protected from subsequent processing by the oxide caps 35A and 35B.

Figure 11:
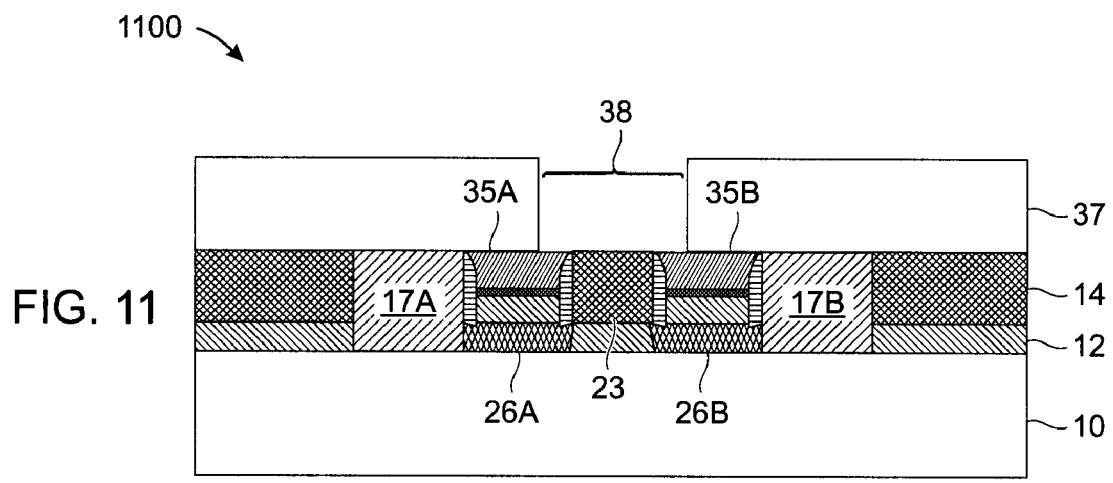

FIG. 11 is a cross-sectional diagram of a wafer substrate 1100 representative of the wafer substrate 1000 of FIG. 10 after disposing a third mask layer 37 thereover. An opening 38 in the third mask layer 37 exposes the dummy gate 23. Accurate alignment of the opening 38 to the dummy gate 23 is not critical, since subsequent oxygen plasma etching is selective to the CVD diamond material of which the dummy gate 23 is formed.

Figure 12:
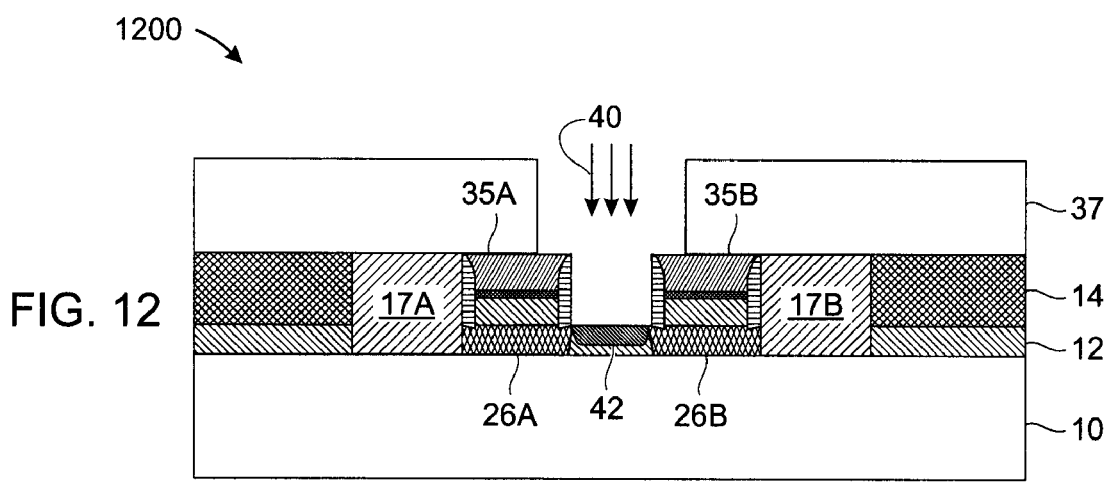

FIG. 12 is a cross-sectional diagram of a wafer substrate 1200 representative of the wafer substrate 1100 of FIG. 11 after employing an oxygen plasma etching process to remove the dummy gate 23 and after employing an implantation process (indicated by arrows 40) to form a channel 42 in the thin silicon layer 12 formerly covered by the dummy gate 23. The oxide caps 35A, 35B and sidewall spacers (28A, 28B, see FIG. 9) bound and define the channel 42. The implantation process can be any suitable threshold adjustment implant.

Figure 13:
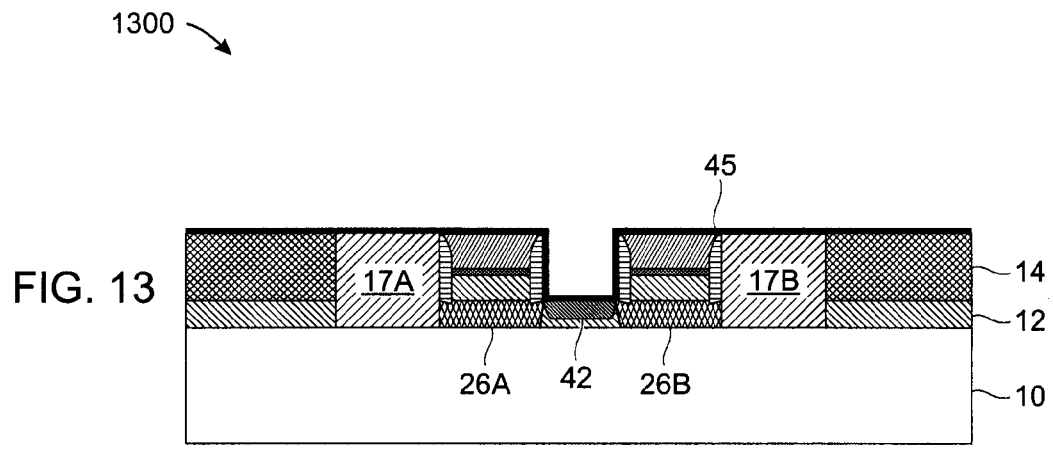

FIG. 13 is a cross-sectional diagram of a wafer substrate 1300 representative of the wafer substrate 1200 of FIG. 12 after removal of the third mask layer 37 and after formation of a gate dielectric 45. Preferably, the gate dielectric 45 is formed by depositing a layer of high-k di-electric material over the entire surface of the substrate 1200. The dielectric material can be conventional thermal oxide, oxy-nitride, low-temperature oxide, or any suitable CVD dielectric material.

Figure 14:
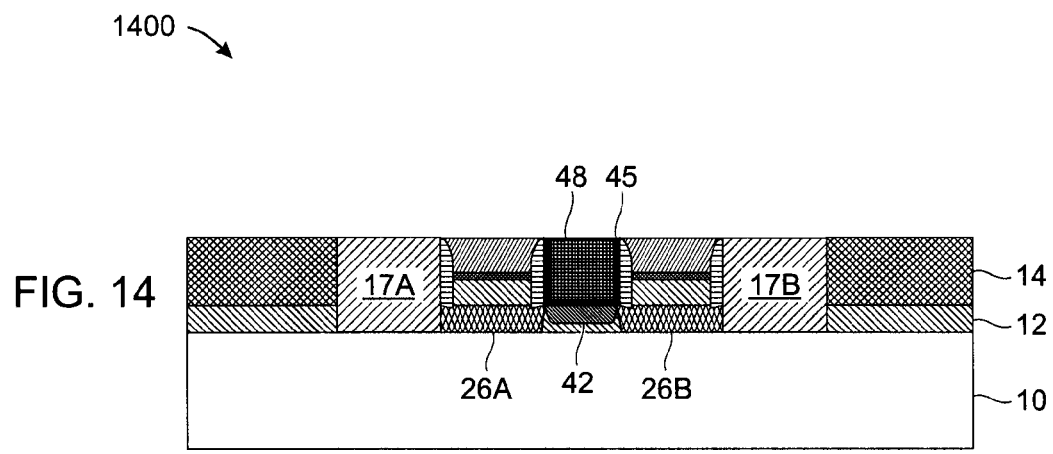

FIG. 14 is a cross-sectional diagram of a wafer substrate 1400 representative of the wafer substrate 1300 of FIG. 13 after depositing a conductive gate material, e.g., doped CVD polysilicon, to form a gate conductor 48 and planarizing (e.g., by chem-mech polishing) to the surface of the polish-stop layer 14. This Damascene process defines the gate and removes excess gate dielectric from the surface of the substrate 1400, thereby forming a gate-conductor 48 inside a cavity which is self-aligned to the boundaries of the source/drain junctions 26A, 26B. The gate conductor 48 will ultimately form part of a segmented gate conductor that will be linked to a subsequently-formed metal wiring layer.

Figure 15A:
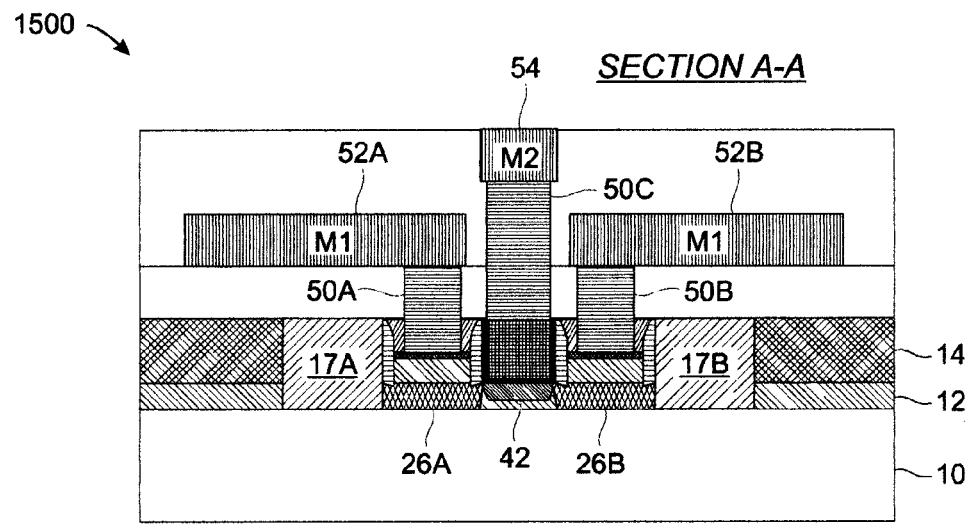
FIG. 15A is a cross-sectional view of a finished MOSFET device in accordance with the invention.

FIG. 15A is a cross-sectional view "A—A" of a wafer substrate 1500 showing a completed MOSFET transistor, in accordance with the present invention. Wafer substrate 1500 is representative of the wafer substrate 1400 after performing "conventional" processing steps form metal wiring layers and to connect the MOSFET transistor structure thereto. In the Figure, oxide caps 35A, 35B have been etched to expose the silicide conductors 32A, 32B (see FIG. 9) and conductive studs 50A and 50B have been formed to connect the source/drain silicide conductors 32A and 32B to metal conductors 52A and 52B, respectively, in a first metal wiring layer (M1). Conductive stud 50C has been formed atop the gate conductor 48 to connect it to a metal conductor 54 in a second wiring layer (M2). Preferably, the conductive studs 50A, 50B and 50C are CVD tungsten or other suitable stud material formed by conventional stud interconnect formation processes. The metal wiring layers M1 and M2 (of which metal conductors 52A, 52B and 54 are parts) are formed by conventional metal layer formation techniques.

Figure 15B:
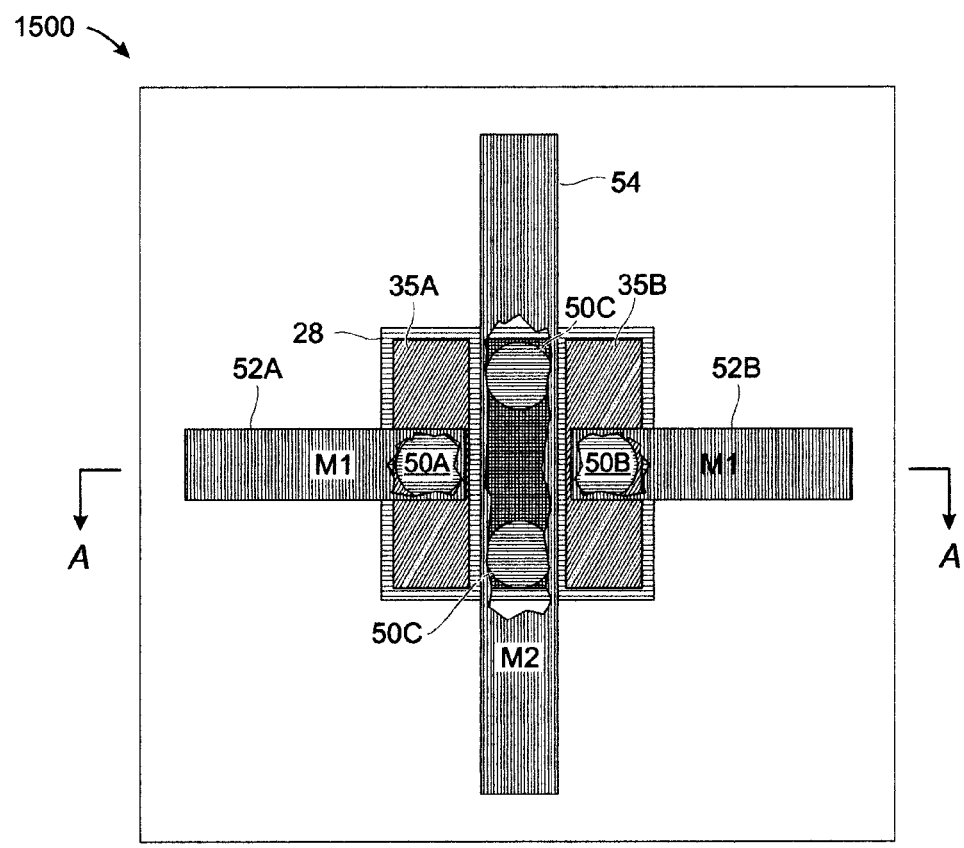
FIG. 15B is a plan view (top view) of a portion of the finished MOSFET device of FIG. 15A, in accordance with the invention.

FIG. 15B is a selective top or "plan" view of the wafer substrate 1500 corresponding to the cross-sectional view of FIG. 15A, showing selected elements of the completed MOSFET transistor. Section line A—A indicates the location of the cross-sectional view of FIG. 15A relative to FIG. 15B. FIG. 15B shows the relative positions of elements of the MOSFET transistor formed in the processing steps described hereinabove with respect to FIGS. 1–15A, including protective caps 35A and 35B, field isolation 28, and metal conductors 52A, 52B and 54. In the view of FIG. 15B, the metal conductors 52A, 52B and 54 are cut away to show the locations of conductive studs 50A, 50B and 50C relative thereto.

Figure 16:
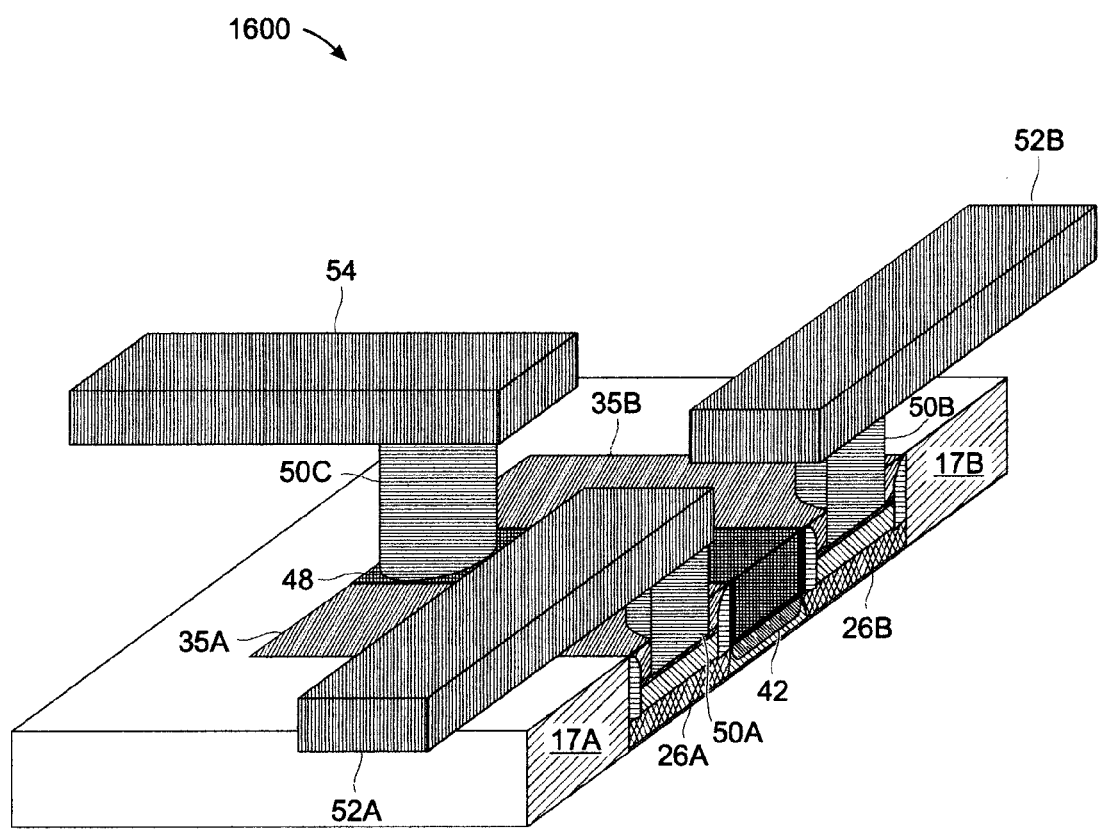
FIG. 16 is an isometric view of selected portions of the finished MOSFET device of FIG. 15A, in accordance with the invention.

FIG. 16 is an isometric view of selected portions 1600 of the finished wafer substrate 1500 of FIGS. 15A and 15B. FIG. 16 shows second level metal (M2) conductor 54 and first level metal (M1) conductors 52A and 52B. Conductive stud 50C connects second level metal (M2) conductor 54 to the gate conductor 48. (Insulating layers between the metallization layers are removed for illustrative clarity). Conductive studs 50A and 50B connect source/drain junctions 26A and 26B, respectively, first-level metal (M1) conductors 52A and 52B, respectively (via elevated source/drain silicon 30A, 30B and source/drain silicide conductors 32A, 32B see FIG. 9). Field isolation oxide "trenches" 17A and 17B can be seen in this view as forming opposing legs of a complete isolation "ring" surrounding the MOSFET transistor.

Those of ordinary skill in the art will immediately understand and appreciate that the inventive transistor structure is readily formed as a part of a CMOS (complementary MOS) circuit, which can in turn be formed as a part of a larger integrated circuit device.

The present inventive technique has several significant advantages. The gate, source and drain regions, the active device region and the isolation region are all self-aligned, eliminating concerns related to source/drain leakage. The isolation regions are formed at a very early stage of the process, eliminating any chance of device-to-device shorting. Unlike prior-art techniques, the inventive MOSFET device is completely "bracketed" on all sides by STI (shallow trench isolation) providing inherent isolation between devices. Further, the process requires no more lithographic mask levels than conventional processing technique, helping to ensure an economical fabrication process.

Other significant characteristics of the MOSFET transistor of the present invention are that the top surface of the STI "ring" is coplanar with the top of the gate and with the tops of the sidewall spacers. Further, the inventive MOSFET exhibits a "U" shaped gate insulator.

Normally, the structure of the present inventive MOSFET transistor requires metal gate-to-gate connections in CMOS devices.

Although shown and described hereinabove with respect to a SOI substrate, those of ordinary skill in the art will immediately understand that the present inventive technique is readily applied to many other substrate forms. With appropriate preparation, the present inventive MOSFET can be formed in bulk silicon, mixed SOI, SOS, etc. It is fully within the spirit and scope of the present invention to do so.

In summary, the present invention provides a fabrication method and a resultant MOSFET device featuring a fully self-aligned, raised source/drain structure on a thin SOI wafer (or other suitable substrate). The resultant MOSFET device has low contact resistance, low gate resistance and good inter-device isolation characteristics. No "extra" lithographic mask steps are required beyond those used by conventional processing techniques. Gate sidewall spacers are formed outside of the gate area so that the scalability of the gate structure is limited solely by lithographic resolution.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means")

used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of forming a MOSFET semiconductor device, comprising:
    providing a semiconductor substrate, said substrate comprising a buried insulating layer, a thin silicon layer overlying the buried insulating layer and a hard polish-stop layer overlying the thin silicon layer;
    forming an isolation area surrounding and defining an active area of the MOSFET device;
    selectively etching away the polish-stop layer to expose source/drain areas of the thin silicon layer;
    implanting the exposed source/drain areas of the thin silicon layer to form source/drain junctions;
    forming sidewall spacers surrounding the source/drain areas along vertical side walls of the isolation material and polish-stop layer between the source/drain areas;
    depositing doped silicon to elevate the source/drain junctions;
    forming source/drain silicide conductors on top of the elevated source/drain junctions;
    forming protective caps over the source/drain silicide conductors;
    removing the polish-stop layer between the source/drain areas to form a gate opening;
    forming a channel in the thin silicon layer;
    forming a thin gate dielectric in the gate opening; and
    forming a gate conductor in the gate opening over the gate dielectric.

2. A method according to claim 1, wherein:
    the polish-stop layer is CVD diamond.

3. A method according to claim 1, wherein:
    the buried insulation layer is oxide.

4. A method according to claim 1, wherein:
    the substrate is a Silicon-on Insulator (SOI) substrate.

5. A method according to claim 1, wherein:
    the isolation material is oxide.

6. A method according to claim 1, wherein:
    the isolation oxide is formed by a Damascene process.

7. A method according to claim 1, wherein:
    the gate conductor is polysilicon.

8. A method according to claim 1, further comprising:
    forming metal wiring layers over the substrate; and
    forming stud conductors to connect the source/drain silicide conductors and gate conductor to metal conductors in the metal wiring layers.

9. A method according to claim 1, wherein:
    a Damascene process is employed to form the gate conductor.

10. A method according to claim 1, wherein:
    the MOSFET semiconductor device is part of a CMOS circuit.

11. A method according to claim 1, wherein:
    the MOSFET semiconductor device is part of an integrated circuit.

12. A method of forming a MOSFET semiconductor device, comprising:
    providing a SOI substrate, said substrate comprising a buried oxide layer, a thin silicon layer overlying the buried oxide layer and a CVD diamond polish-stop layer overlying the thin silicon layer;
    forming an isolation trench surrounding and defining an active area of the MOSFET device, said trench extending downward through the hard polish-stop layer and thin silicon layer to the buried oxide layer;
    filling the isolation trench with via a Damascene CVD oxide deposition process;
    using an oxygen plasma etching process to selectively etch away the polish-stop layer to expose source/drain areas of the thin silicon layer, leaving behind a sacrificial dummy gate structure overlying a channel area of the thin silicon layer;
    using an ion implantation process to dope the exposed source/drain areas of the thin silicon layer to form source/drain junctions;
    forming sidewall spacers surrounding the source/drain areas along vertical side walls of the isolation material and dummy gate structure;
    forming elevated source/drain junctions by employing a Damascene process to elevate the source drain junctions to a level flush with a top surface of the polish-stop layer followed by a controlled etching process to recess the elevated source drain junctions back to a suitable depth;
    employing a silicidation process to form silicide atop the elevated source/drain junctions;
    forming protective caps over the source/drain silicide conductors;
    using a selective oxygen plasma etching process to removing the sacrificial dummy gate to form a gate opening;
    ion implanting the channel area of the thin silicon layer to form a channel;
    forming a thin gate dielectric in the gate opening;
    forming a gate conductor in the gate opening over the gate dielectric and planarizing such that a top surface of the gate conductor, tops of the sidewall spacers and a top surface of the STI are all coplanar;
    forming first and second-level metal interconnect layers and connecting the source/drain silicide conductors and gate conductor to respective metal conductors in the interconnect layer via conductive studs.

* * * * *